United States Patent
Kobayakawa et al.

(10) Patent No.: US 7,488,971 B2
(45) Date of Patent: Feb. 10, 2009

(54) NITRIDE SEMICONDUCTOR; LIGHT-EMITTING DEVICE, LIGHT-EMITTING DIODE, LASER DEVICE AND LAMP USING THE SEMICONDUCTOR; AND PRODUCTION METHODS THEREOF

(75) Inventors: Masato Kobayakawa, Chiba (JP); Hideki Tomozawa, Chiba (JP); Mineo Okuyama, Chiba (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 10/574,202

(22) PCT Filed: Oct. 1, 2004

(86) PCT No.: PCT/JP2004/014873

§ 371 (c)(1),
(2), (4) Date: Mar. 31, 2006

(87) PCT Pub. No.: WO2005/034253

PCT Pub. Date: Apr. 14, 2005

(65) Prior Publication Data

US 2007/0012932 A1 Jan. 18, 2007

Related U.S. Application Data

(60) Provisional application No. 60/509,997, filed on Oct. 10, 2003.

(30) Foreign Application Priority Data

Oct. 2, 2003 (JP) ............................. 2003-344599

(51) Int. Cl.
*H01L 29/06* (2006.01)

(52) U.S. Cl. ......................................... 257/13; 257/79
(58) Field of Classification Search .................. 257/13, 257/79, 94; 438/22
See application file for complete search history.

(56) References Cited

U.S. PATENT DOCUMENTS 5,926,726 A * 7/1999 Bour et al. ................... 438/507
2002/0070681 A1 * 6/2002 Shimizu et al. ............. 315/246

FOREIGN PATENT DOCUMENTS

| JP | 2001-102629 A | 4/2001 |
| JP | 2002-43618 A | 2/2002 |
| JP | 2002043618 A * | 2/2002 |
| JP | 2002-133925 A | 5/2002 |
| JP | 2002-043618 * | 8/2002 .................. 257/79 |
| JP | 2003-229645 A | 8/2003 |

* cited by examiner

*Primary Examiner*—Jami M Valentine
(74) *Attorney, Agent, or Firm*—Sughrue Mion, PLLC

(57) ABSTRACT

A nitride semiconductor product including an n-type layer, a light-emitting layer, and a p-type layer which are formed of a nitride semiconductor and sequentially stacked on a substrate in the above order, the light-emitting layer having a quantum well structure in which a well layer is sandwiched by barrier layers having band gaps wider than the band gap of the well layer. Each barrier layer includes a barrier sublayer C which has been grown at a temperature higher than a growth temperature of the well layer, and a barrier sublayer E which has been grown at a temperature lower than a growth temperature of the barrier sublayer C. The barrier sublayer C is disposed closer to the substrate with respect to the barrier sublayer E.

26 Claims, 3 Drawing Sheets

US 7,488,971 B2

NITRIDE SEMICONDUCTOR; LIGHT-EMITTING DEVICE, LIGHT-EMITTING DIODE, LASER DEVICE AND LAMP USING THE SEMICONDUCTOR; AND PRODUCTION METHODS THEREOF

CROSS REFERENCE TO RELATED APPLICATION

This application is an application filed under 35 U.S.C. §111(a) claiming benefit pursuant to 35 U.S.C. §119(e)(1) of the filing date of the Provisional Application No. 60/509,997 filed on Oct. 10, 2003, pursuant to 35 U.S.C. §111(b).

TECHNICAL FIELD

The present invention relates to a nitride semiconductor product; to a light-emitting device, a light-emitting diode, a laser device, and a lamp, all employing the nitride semiconductor product; and to production methods therefor.

BACKGROUND ART

In recent years, nitride semiconductor materials have become of interest as materials for producing a semiconductor light-emitting device which emits light of short wavelength. Generally, a nitride semiconductor is grown on a substrate (e.g., oxide crystals such as a sapphire single crystal or Group III-V compound semiconductor crystals) through a method such as metalorganic chemical vapor deposition (MOCVD), molecular-beam epitaxy (MBE), or hydride vapor phase epitaxy (HVPE), thereby forming an n-type layer, a light-emitting layer, and a p-type layer, which are stacked on the substrate.

At present, among these methods, metalorganic chemical vapor deposition (MOCVD) is most widely employed in the industry as a method for growing compound semiconductor crystals. In MOCVD, an organometallic compound serving as a Group III source gas is fed, along with a Group V source gas into a reactor tube in which a substrate such as sapphire, SiC, GaN, or AlN is placed, and crystal growth is performed at about 700° C. to about 1,200° C., to thereby form an n-type layer, a light-emitting layer, and a p-type layer.

After completion of growth of these semiconductor layers, a negative electrode is formed on the substrate or the n-type layer, and a positive electrode is formed on the p-type layer, whereby a light-emitting device is provided.

Conventionally, the light-emitting layer employs InGaN having a composition regulated for emitting light of a desired wavelength. When the InGaN layer is sandwiched by layers having wider band gaps, a light-emitting layer of a double-heterojunction structure is produced. Alternatively, a light-emitting layer of a multiple quantum well structure is produced from the InGaN layer on the basis of a quantum well effect.

Conventionally known multiple quantum well structures include a quantum well structure of InGaN—GaN included in a Group III-V (GaN-based) light-emitting device (F. Scholz et al., "Investigation on Structural Properties of GaInN—GaN Multi Quantum Well Structures," Phys. Stat. Sol. (a), Vol. 180, (2000), p. 315). The process for growing the quantum well structure includes maintaining a substrate at 1,000° C., forming a barrier layer at high temperature, lowering the substrate temperature, maintaining the substrate at the lowered temperature, and forming an InGaN well layer. Alternating formation of the barrier layer and the well layer is repeated, to thereby form a light-emitting layer.

In a known variation of the aforementioned technique, the barrier layers are grown with elevating temperature, the barrier layers are stacked at high speed, and nitrogen serving as a carrier gas is replaced by hydrogen (Japanese Patent Application laid-Open (kokai) No. 2002-43618). The technique suitably attains enhancement of emission efficiency, reduction of production cost by shortening the time of forming the light-emitting layer, prevention of sublimation of In through growth with temperature elevation, and other effects.

The light-emitting devices fabricated through stacking of the layers based on any of the aforementioned methods have the problem that reverse withstand voltage (i.e., the absolute value of the voltage required for inducing flow of a 10 µA current in the reverse direction in a light-emitting device having a P—N junction) is deteriorated as time elapses in an aging process.

Specifically, a current of 30 mA is caused to flow in the forward direction in each light-emitting device, and reverse withstand voltage of the light-emitting device is measured before and after the device is allowed to stand for a predetermined period of time. In the experiments described in the Examples of the present specification, the reverse withstand voltage is measured after maintenance of 0 hour, 20 hours, and 40 hours.

The light-emitting devices fabricated through stacking layers on the basis of the above-disclosed conventional techniques fail to attain a desired emission strength. Thus, there is a demand for further enhancement of emission efficiency.

DISCLOSURE OF INVENTION

An object of the present invention is to provide a nitride semiconductor device which causes no time-dependent deterioration in reverse withstand voltage and maintains a satisfactory initial reverse withstand voltage.

Another object of the present invention is to provide a nitride semiconductor product which attains excellent emission intensity and emission efficiency.

Further object of the present invention is to provide a nitride semiconductor device which has a low forward voltage as well as maintaining a satisfactory initial reverse withstand voltage.

Accordingly, the present invention provides the following.

(1) A nitride semiconductor product comprising an n-type layer, a light-emitting layer, and a p-type layer which are formed of a nitride semiconductor and sequentially stacked on a substrate in the above order, the light-emitting layer having a quantum well structure in which a well layer is sandwiched by barrier layers having band gaps wider than the band gap of the well layer, wherein each barrier layer comprises a barrier sublayer C which has been grown at a temperature higher than a growth temperature of the well layer, and a barrier sublayer E which has been grown at a temperature lower than a growth temperature of the barrier sublayer C, and the barrier sublayer C is disposed closer to the substrate with respect to the barrier sublayer E.

(2) A nitride semiconductor product as described in (1) above, wherein the nitride semiconductor is represented by formula $In_xAl_yGa_{1-x-y}N$ ($0 \leq x < 1$, $0 \leq y < 1$, $0 \leq x+y < 1$).

(3) A nitride semiconductor product as described in (1) or (2) above, wherein one or more of the barrier layers further comprise a barrier sublayer A which has been grown at a temperature lower than a growth temperature of the barrier sublayer C, and the barrier sublayers A, C, and E are stacked, in this order.

(4) A nitride semiconductor product as described in (3) above, wherein one or more of the barrier layers comprise a barrier sublayer B which has been grown at a temperature lower than a growth temperature of the barrier sublayer C, the barrier sublayer B intervening between the barrier sublayers A and C.

(5) A nitride semiconductor product as described in any one of (1) to (4) above, wherein one or more of the barrier layers comprise a barrier sublayer D which has been grown at a temperature lower than a growth temperature of the barrier sublayer C, the barrier sublayer D intervening between the barrier sublayers C and E.

(6) A nitride semiconductor product as described in any one of (1) to (5) above, wherein the difference between the growth temperature of the barrier sublayer C and the growth temperature of the well layer is 50° C. or more.

(7) A nitride semiconductor product as described in any one of (1) to (6) above, wherein the difference between the growth temperature of the barrier sublayer C and the growth temperature of the barrier sublayer E is 50° C. or more.

(8) A nitride semiconductor product as described in any one of (3) to (7) above, wherein the difference between the growth temperature of the barrier sublayer C and the growth temperature of the barrier sublayer A is 50° C. or more.

(9) A nitride semiconductor product as described in any one of (1) to (8) above, wherein the growth temperature of the well layer falls within a range of 600° C. to 1,000° C.

(10) A nitride semiconductor product as described in any one of (2) to (9) above, wherein the well layer comprises GaInN.

(11) A nitride semiconductor product as described in any one of (2) to (10) above, wherein the barrier layer comprises GaInN or GaN.

(12) A nitride semiconductor product as described in any one of (1) to (11) above, wherein at least one layer selected from the well layer and the barrier layer contains an n-type dopant.

(13) A nitride semiconductor product as described in (12) above, wherein the n-type dopant is an Si.

(14) A nitride semiconductor product as described in (12) above, wherein the n-type dopant is a Ge.

(15) A nitride semiconductor product as described in any one of (12) to (14) above, wherein a concentration of the n-type dopant in at least one layer selected from the well layer and the barrier layer varies periodically.

(16) A nitride semiconductor product as described in (15) above, wherein a layer containing the n-type dopant and an undoped layer are stacked alternately.

(17) A nitride semiconductor product as described in (15) or (16) above, wherein a higher layer at the concentration of the n-type dopant is not thicker than a lower layer.

(18) A nitride semiconductor product as described in any one of (12) to (17) above, wherein the layer containing the n-type dopant has an n-type dopant concentration of $1 \times 10^{16}$ to $5 \times 10^{19}$ cm$^{-3}$.

(19) A nitride semiconductor light-emitting device comprising a nitride semiconductor product as recited in any one of (1) to (18) above, a negative electrode provided on an n-type layer of the nitride semiconductor product and a positive electrode provided on a p-type layer of the nitride semiconductor product.

(20) A light-emitting diode comprising a nitride semiconductor product as recited in any one of (1) to (18) above.

(21) A laser device comprising a nitride semiconductor product as recited in any one of (1) to (18) above.

(22) A lamp comprising a nitride semiconductor product as recited in any one of (1) to (18) above.

(23) A method for producing a nitride semiconductor product, the method comprising sequentially stacking on a substrate a nitride semiconductor n-type layer, a nitride semiconductor light-emitting layer of a quantum well structure, and a nitride semiconductor p-type layer, thereby producing a nitride semiconductor product having a quantum well structure, wherein the method comprises growing a well layer;

subsequently, elevating a growth temperature;

growing a barrier layer of the quantum well structure at the elevated temperature, which is higher than a growth temperature of the well layer;

subsequently, lowering the growth temperature; and further growing the barrier layer at the lowered temperature.

(24) A method for producing a nitride semiconductor product as described in (23) above, which further comprises growing the barrier layer before elevating the growth temperature.

(25) A method for producing a nitride semiconductor product as described in (23) or (24) above, wherein growing of the barrier layer is performed in at least one step of elevating the growth temperature and lowering the growth temperature.

(26) A method for producing a nitride semiconductor product as described in any one of (23) to (25) above, wherein the barrier layer contains an n-type dopant.

(27) A method for producing a nitride semiconductor light-emitting device, the method comprising a step of removing a portion of a light-emitting layer and a p-type layer of a nitride semiconductor product as recited in any one of (1) to (18) above, thereby exposing an n-type layer, a step of providing a negative electrode on the exposed n-type layer, and a step of providing a positive electrode on the p-type layer.

(28) A method for producing a light-emitting diode, comprising a step of providing a lead to a nitride semiconductor light-emitting device as recited in (19) above.

(29) A method for producing a laser device, comprising a step of providing a lead to a nitride semiconductor light-emitting device as recited in (19) above.

(30) A method for producing a lamp, comprising a step of providing a cover containing a phosphor to a nitride semiconductor light-emitting device as recited in (19) above.

According to the present invention, a nitride semiconductor light-emitting device which has a semiconductor of high crystallinity, attains high emission efficiency, and minimizes deterioration of reverse withstand voltage characteristics can be formed through controlling of the growth temperature of a barrier layer after completion of growth of a well layer at a substrate temperature suitable for growing the well layer.

Also, a nitride semiconductor light-emitting device, which has a low forward voltage as well as maintaining a satisfactory initial reverse withstand voltage, can be formed through doping an n-type dopant in a well layer and/or a barrier layer while controlling the growth temperature.

BEST MODE FOR CARRYING OUT THE INVENTION

A characteristic feature of the present invention is that, in a nitride semiconductor product including an n-type layer, a light-emitting layer, and a p-type layer which are sequentially stacked on a substrate, the light-emitting layer having a quantum well structure in which a well layer is sandwiched by barrier layers having band gaps wider than the band gap of the well layer, the quantum well structure is produced under specific temperature conditions.

Figure 1:
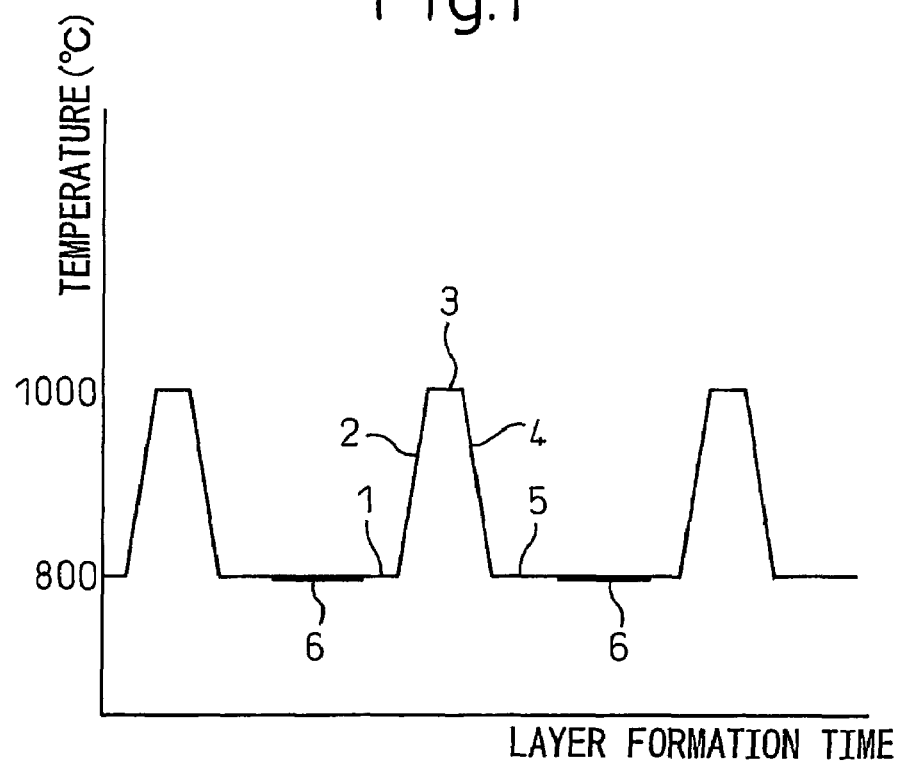
FIG. 1 is a graph showing a growth temperature profile of a quantum well structure of the nitride semiconductor light-emitting layer of Example 1.

FIG. 1 is a graph showing a growth temperature profile of a quantum well structure of a nitride semiconductor light-emitting layer of Example 1. In the growth temperature profile, a barrier sublayer (1) whose growth is started at low temperature after completion of growth of a well layer (6) is hereinafter referred to as "barrier sublayer A." In a similar manner, a barrier sublayer (2) which is growth in a temperature elevation step is referred to as "barrier sublayer B," a barrier sublayer (3) which is grown by maintaining the elevated growth temperature is referred to as "barrier sublayer C," a barrier sublayer (4) which is growth in a temperature lowering step is referred to as "barrier sublayer D," and a barrier sublayer (5) which is grown by maintaining the lowered growth temperature after lowering the temperature is referred to as "barrier sublayer E."

In the nitride semiconductor product of the present invention, the composition of each of an n-type layer, a light-emitting layer, and a p-type layer may be any conventionally known composition. Generally, each of these layers employs a specific composition falling within a range represented by formula $In_xAl_yGa_{1-x-y}N$ ($0\leq x<1$, $0\leq y<1$, $0\leq x+y<1$). The n-type layer and the p-type layer preferably has a composition of $Al_yGa_{1-y}N$ ($0\leq y<1$). Any conventionally employed configurations of the semiconductor products may be employed. For example, a light-emitting layer is sandwiched by a p-type layer and an n-type layer, and a contact layer may be formed on a portion of the p-type layer or the n-type layer for providing an contact electrode. Light emission is performed through injection of current via electrode each in contact with the p-type electrode or the n-type electrode.

No particular limitation is imposed on the substrate of the nitride semiconductor product of the present invention, and any of conventionally known substrates may be employed. Examples of the substrate material include sapphire, SiC, GaN, AlN, Si, ZnO, and other oxide substrates. Among these, sapphire is preferred. In order to grow a nitride semiconductor on a substrate through epitaxy, a buffer layer (e.g., GaN buffer, AlN buffer, SiN buffer, or AlGaN buffer) may also be provided.

In the nitride semiconductor product of the present invention, the light-emitting layer preferably has a quantum well structure in which a well layer having small band gap energy is sandwiched by barrier layers having large band gap energy. In a quantum well structure composed of well layers and barrier layers, no particular limitation is imposed on the number of pairs (each pair including one well layer and one barrier layer), and the number is generally 1 to 100, preferably 1 to 50, more preferably 1 to 20. When the number is greater than 100, productivity of semiconductor products decreases, which is not preferred.

The well layer preferably has a composition of $In_{x1}Ga_{1-x1}N$ ($0\leq x1\leq 0.5$) for attaining emission of a desired wavelength. The x1 is preferably more than 0.01, more preferably more than 0.05. The barrier layers preferably have a composition of $In_{x2}Ga_{1-x2}N$ ($0\leq x2<x1$) from the viewpoint of carrier confining effect. The difference between x1 and x2 (i.e., x1−x2) is preferably more than 0.01, more preferably more than 0.05. When the difference is less than 0.01, confinement of carriers cannot be attained. The "x2" is particularly preferably less than 0.1.

Also, the well and/or barrier layer may contain an n-type dopant. Without regard to containing the n-type dopant, high emission efficiency can be attained as compared with conventional light-emitting device. When the n-type dopant is contained, although a emission intensity is slightly decreased, a forward voltage is very decreased. For example, a forward voltage decrease reaches about 0.4 V at a current of 20 mA. Particularly, when the barrier layer contains the n-type dopant, a forward voltage is more decreased.

No particular limitation is imposed on the employable n-type dopant, and any of conventionally known n-type dopants may be employed in the present invention. For example, these include Si, Ge, Sn, S, Se and Te. Si and Ge are preferable.

Generally, the n-type dopant content, which is varied dependent on a kind of dopant, is preferably $1\times 10^{16}$ to $5\times 10^{19}$ $cm^{-3}$. In this range, the emission intensity is scarcely decreased and the forward voltage is very decreased.

An n-type dopant concentration (content) can be constant throughout the layer. It also may be varied periodically in the layer. When it is varied periodically, a surface flatness of each layer is improved preferably. To vary the concentration periodically, it is preferable that a supply of dopant is alternated at intervals of 3 to 30 second, preferably 5 to 20 second.

When the concentration is varied periodically, if a high concentration layer satisfies aforementioned concentration, a low concentration layer may be at lower concentration. Rather, it is preferable that the low concentration layer is an undoped layer, because the surface flatness is improved and the forward voltage is decreased. Generally, both of the high and low concentration layers have thickness of 0.1 to 0.2 nm preferably. Within this range, the high concentration layer is not thicker than the low concentration layer preferably, because a pit on a surface of the high concentration layer is filled with the low concentration layer, and thereby the surface flatness is improved.

The temperature at which a barrier layer is formed is a key factor in the present invention. The barrier layer of the present invention essentially includes a barrier sublayer C and a barrier sublayer E, which are stacked on the substrate in that order. The barrier sublayer C is formed at a temperature higher than a growth temperature of the well layer, and the barrier sublayer E is formed at a temperature lower than a growth temperature of the barrier sublayer C. If either of sublayer C or E is absent in the semiconductor product, time-dependent deterioration of reverse withstand voltage characteristics cannot be prevented.

The growth temperature of the well layer is preferably 600° C. to 1,000° C., more preferably 650° C. to 950° C., most preferably 700° C. to 800° C. When the growth temperature of the well layer is lower than 600° C., the formed well layer has poor crystallinity, whereas when the growth temperature is higher than 1,000° C., a desired In concentration cannot be obtained. The growth temperature of the barrier sublayer C is preferably 650° C. to 1,300° C., more preferably 700° C. to 1,250° C., most preferably 750° C. to 1,200° C. When the growth temperature of the barrier sublayer C is lower than 650° C., the formed layer has poor crystallinity, whereas when the growth temperature is higher than 1,300° C., the well layer may be adversely affected. The growth temperature of the barrier sublayer E is preferably 600° C. to 1,250° C., more preferably 650° C. to 1,000° C., most preferably 700° C. to 900° C. When the growth temperature of the barrier sublayer E is lower than 600° C., the semiconductor of the formed layer has undesirably poor crystallinity, whereas when the growth temperature is higher than 1,250° C., time dependent deterioration of reverse withstand voltage characteristics cannot be prevented.

The difference between the growth temperature of the well layer and the temperature of the barrier sublayer C preferably falls within a range of 50° C. to 300° C. as an effective temperature. The temperature difference is more preferably 100° C. or more, most preferably 150° C. or more. Similarly, the difference between the growth temperature of the barrier sublayer C and the temperature of the barrier sublayer E preferably falls within a range of 50° C. to 300° C. as an effective temperature. The temperature difference is more preferably 100° C. or more, most preferably 150° C. or more. When difference between the growth temperature of the well layer and the temperature of the barrier sublayer C or the difference between the growth temperature of the barrier sublayer C and the temperature of the barrier sublayer E is less than 50° C., high emission efficiency—one of the characteristic features of the invention—cannot be attained and the effect of preventing lowering of reverse withstand voltage during aging decreases, whereas when the temperature difference is more than 300° C., the well layer is adversely affected, resulting in lowering of the emission efficiency.

When the barrier sublayers C and E are grown with varying the growth temperature (e.g., the barrier sublayer C is grown not at a constant temperature but at a varying temperature), excellent emission efficiency and effect of preventing lowering of reverse withstand voltage characteristics can be attained, so long as the growth temperature of the barrier sublayer C is higher than that of the barrier sublayer E.

In addition, a barrier sublayer A, which has been grown at a temperature lower than the growth temperature of the barrier sublayer C, may be provided between the barrier sublayer C and the well layer, to thereby form a three-layer structure in which the barrier sublayers A, C, and E are stacked in that order. The three-layer structure is preferred, since the emitted light has high intensity. The difference between the growth temperature of the barrier sublayer A and that of the barrier sublayer C preferably falls within the same range as mentioned in relation to the barrier sublayer E.

The growth of the barrier layer may also be carried out in the step of temperature elevation (to reach the growth temperature of the barrier sublayer C) and the step of temperature lowering (to reach the growth temperature of the barrier sublayer E), thereby forming barrier sublayers B and D, respectively. The barrier sublayers B and D are preferably provided, since the emitted light has high intensity.

The thickness of the well layer suitable for fabricating the quantum well structure of the present invention is preferably 1 nm to 8 nm, more preferably 1 nm to 6 nm, most preferably 1 nm to 4 nm. When the thickness is less than 1 nm, intensity of the emitted light is poor, whereas when the thickness is in excess of 8 nm, the well layer has poor confining effect. The total thickness of the barrier sublayers A to E is preferably 3 nm to 40 nm, more preferably 3 nm to 30 nm, most preferably 3 nm to 20 nm. When the total thickness is in excess of 40 nm, forward current characteristics are impaired, whereas when the total thickness less than 3 nm, carrier-confining effect is insufficient. Each of the barrier sublayers C and E preferably has a thickness of 1 nm or more. When the thickness of the barrier sublayer C is less than 1 nm, intensity of the emitted light is poor. When the thickness of the barrier sublayer E is less than 1 nm, effect of preventing time-dependent deterioration of reverse withstand voltage characteristics is insufficient. Each of other barrier sublayers may be appropriately selected so that the total thickness of the barrier sublayers falls within the above range.

Although no particular limitation is imposed on the method for producing the nitride semiconductor product of the present invention, metalorganic chemical vapor deposition (MOCVD) is preferably employed. Other than this, any of conventionally known methods such as molecular-beam epitaxy (MBE) and hydride vapor phase epitaxy (HVPE) may also be employed.

The MOCVD technique is well known in the art, and the semiconductor product may be produced through the technique under any known conditions.

For example, hydrogen or nitrogen may be used as a carrier gas, and ammonia ($NH_3$) or hydrazine may be used as a nitrogen source. Examples of the employable Group III element source include trimethylgallium (TMG), triethylgallium (TEG), trimethylaluminum (TMA), and trimethylindium (TMI). The pressure of these source gases, which depends on the employed apparatus, is generally 20 kPa to 120 kPa.

As for the n-type dopant source, example of the employable source of Si includes monosilane ($SiH_4$) etc., and examples of the employable source of Ge include germane ($GeH_4$) and organic germanium compounds such as tetramethylgermanium (($CH_3$)$_4$Ge) and tetraethylgermanium (($C_2H_5$)$_4$Ge). In the MBE, an elemental germanium may be employed. In the MOCVD, for example, Ge-doped n-type GaN layer is formed in using ($CH_3$)$_4$Ge on a sapphire substrate. Also, examples of the employable p-type dopant source include dimethylzinc (Zn($CH_3$)$_2$) and cyclopentadienylmagnesium ($Cp_2Mg$).

EXAMPLES

The nitride semiconductor product of the present invention will next be described in detail by way of examples, which should not be construed as limiting the invention thereto.

Example 1

In Example 1, a buffer layer and an n-type layer were formed on a sapphire substrate through MOCVD, and a multiple quantum well structure was formed thereon. On the quantum well structure, an Mg-doped p-type GaN layer is formed, to thereby fabricate a nitride semiconductor product.

The aforementioned nitride semiconductor product containing a GaN layer was fabricated through MOCVD by the following procedure. Firstly, a sapphire substrate was placed in a quartz-made reactor which was set in an RF coil of an induction heater. After the sapphire substrate had been placed on a carbon susceptor for heating, the interior of the reactor was evacuated so as to discharge gas, and nitrogen gas was fed to the reactor for 10 minutes for the purpose of purging. Subsequently, the induction furnace was operated so that the temperature of the substrate was elevated to 1,170° C. over 10 minute. While the substrate temperature was maintained at 1,170° C. and the substrate was allowed to stand for nine minutes under the passage of hydrogen and nitrogen, the surface of the substrate was thermally cleaned. During the thermal cleaning, hydrogen carrier gas was caused to flow via piping to each of the vessels (bubblers) which were connected to the reactor and individually contained trimethylgallium (TMG) or cyclopentadienylmagnesium ($Cp_2Mg$) serving as vapor growth sources. Each bubbler was maintained under thermostatic conditions by use of a thermostatic bath. Until the start of the growth of a GaN layer, the vapor of each source generated by bubbling was fed with the carrier gas to a removal apparatus via piping, and was discharged outside the growth system. After completion of thermal cleaning, the substrate temperature was lowered to 510° C. by controlling the induction heater, and nitrogen was fed into the reactor by opening the valve for nitrogen carrier gas. Ten minutes after the start of feeding nitrogen, TMG and ammonia were fed into the reactor by opening the valves for TMG piping and ammonia gas piping, thereby forming a GaN buffer layer on the substrate. The growth of the buffer layer was continued for about 10 minutes, and the TMG valve was closed so as to stop feeding TMG, thereby terminating the growth of the buffer layer.

After formation of the buffer layer, an n-type layer was formed on the buffer layer. Initially, the substrate was heated to 1,060° C. In order to prevent sublimation of the buffer layer, a carrier gas (nitrogen and hydrogen) and ammonia gas were fed to the reactor. Subsequently, the temperature was elevated to 1,150° C. After confirmation of stable temperature conditions, a gas containing the gallium source vapor was fed to the reactor by opening the valve for TMG piping, thereby growing a GaN layer on the buffer layer. Growth of the GaN layer was continued for about one hour. Subsequently, $SiH_4$ was fed to the reactor by opening the valve for $SiH_4$ piping, and an Si-doped GaN layer was grown for about one hour. The growth was stopped by closing the valves, and the temperature was lowered to 800° C.

Then, triethylgallium (TEG), trimethylindium (TMI), and ammonia gas were fed to the reactor by opening the corresponding valves, thereby growing an $In_{0.04}Ga_{0.96}N$ cladding layer.

Subsequently, a light-emitting layer having the quantum well structure according to the present invention was formed. FIG. 1 shows the growth temperature profile for forming the quantum well structure of Example 1.

To a substrate which was maintained at 800° C., ammonia (14 L/min) and TEG (30 cc/min) were fed by the mediation of nitrogen (14 L/min) serving as a carrier gas, thereby growing a GaN barrier sublayer A of the quantum well structure for one minute. Then, a barrier sublayer B was grown while the temperature was elevated to 1,000° C. over two minutes, followed by growing a barrier sublayer C while the temperature was maintained at 1,000° C. for two minutes. Thereafter, a barrier sublayer D was grown while the temperature was lowered to 800° C. over two minutes, followed by growing a barrier sublayer E while the temperature was maintained at 800° C. for four minutes.

Hereinafter, a first barrier layer of the quantum well structure is referred to as barrier layer 1, and a first well layer is referred to as well layer 1. In a similar manner, a second barrier layer is referred to as barrier layer 2, and the same convention is applied to the subsequent layers.

Subsequently, TMI (30 cc/min) was further fed, while the temperature was maintained at 800° C., thereby growing a well layer 1 of the quantum well structure formed of $In_{0.07}Ga_{0.93}N$.

The same procedure was repeated five times, to thereby form 5 pairs of the quantum well structure, and a barrier layer 6 was further grown, thereby fabricating a multiple quantum well structure. The pressure of feeding the source gases was controlled to 50 kPa.

After formation of the multiple quantum well structure having five pairs, the temperature was elevated to 1,050° C. TMG, $Cp_2Mg$, and ammonia gas were fed to the reactor by opening the corresponding valves, thereby growing a p-type GaN layer. Thus, the nitride semiconductor product of the present invention was fabricated.

After completion of growth of the GaN layer, the substrate temperature was lowered to room temperature over 20 minutes by controlling the induction heater.

During lowering of the temperature, the interior atmosphere of the reactor was composed of ammonia, nitrogen, and hydrogen, which were also employed during growth of the semiconductor layers. After the substrate temperature had been confirmed to be 400° C., feeding of ammonia and hydrogen was stopped. The substrate temperature was then lowered to room temperature under passage of nitrogen, and the thus fabricated nitride semiconductor product was removed from the reactor to the air.

The nitride semiconductor product of the present invention produced through the aforementioned steps had a structure including an undoped GaN layer (thickness: 2 µm); an Si-doped n-type GaN layer (thickness: 2 µm); an InGaN cladding layer (thickness: 0.2 µm); a light-emitting layer of a multiple quantum well structure containing barrier layers (thickness: 7 nm) and well layers (thickness: 3 nm); and a p-type GaN layer (thickness: 150 nm), which were sequentially stacked on a sapphire substrate having a GaN buffer layer.

A negative electrode was provided on the Si-doped n-type GaN layer of the semiconductor product, and a positive electrode was provided on the p-type GaN layer, through conventional means well known in the art, thereby fabricating a nitride semiconductor light-emitting device.

Figure 5:
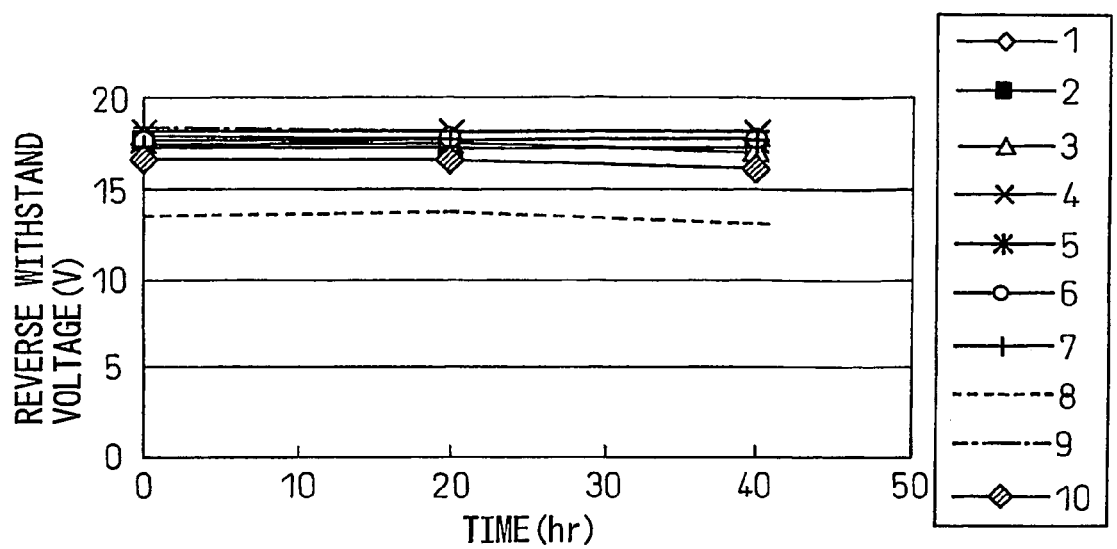
FIG. 5 is a graph showing aging test results of samples of Examples 1 and 2.

The light-emitting device was subjected to an aging test by flowing a forward current of 30 mA. In the test, reverse withstand voltage (the absolute value of the voltage required for inducing flow of a 10 µA current in the reverse direction in a light-emitting device having a P—N junction) was measured at 0 hour, 20 hours after, and 40 hours after the start of the test. The results are shown in FIG. 5. In FIG. 5, numerals 1 to 5 represent the samples of Example 1. No deterioration in reverse withstand voltage was observed 40 hours after the start of the test.

At a current of 20 mA, the device exhibited the following emission characteristics: wavelength of 462 nm, forward voltage of 3.4 mV, and output of 6.0 mW, indicating excellent emission efficiency.

Through conventional means well known in the art, a lead or a phosphor-containing cover was attached to the light-emitting device, thereby fabricating a light-emitting diode, a laser device, or a lamp.

Example 2

Figure 2:
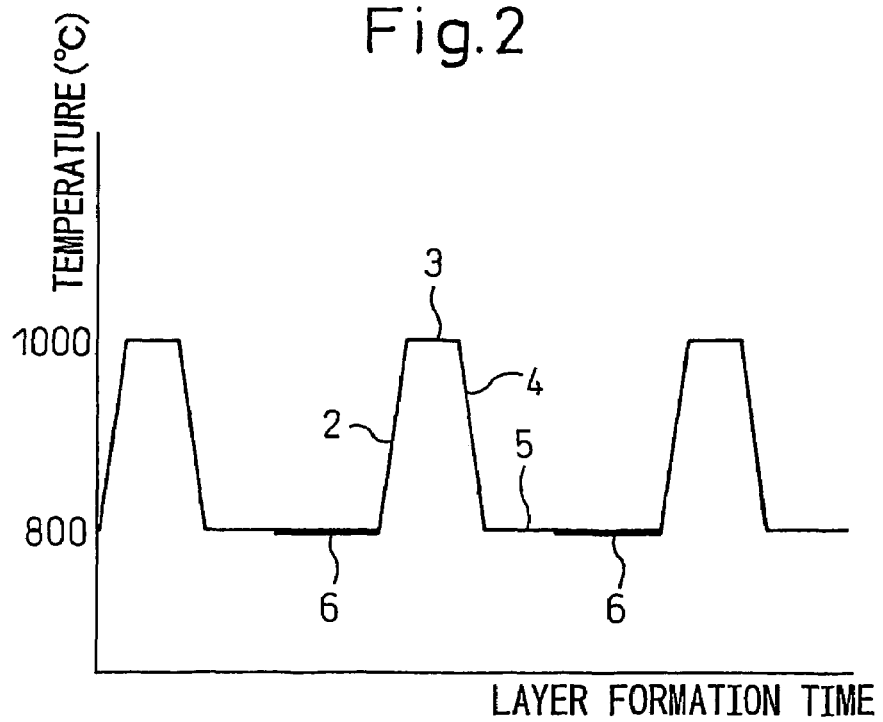
FIG. 2 is a graph showing a growth temperature profile of a quantum well structure of the nitride semiconductor light-emitting layer of Example 2.

The procedure of Example 1 was repeated, except that the temperature elevation was initiated immediately after the growth of an $In_{0.04}Ga_{0.96}N$ cladding layer, that the temperature was elevated to 1,000° C. over two minutes, and that a barrier sublayer A was not formed, to thereby fabricate a nitride semiconductor product and a nitride semiconductor light-emitting device. FIG. 2 shows a growth temperature profile of a quantum well structure of Example 2.

In FIG. 5, numerals 6 to 10 represent the samples of Example 2. Similar to Example 1, no deterioration in reverse withstand voltage was observed 40 hours after the start of the test.

At a current of 20 mA, the device exhibited the following emission characteristics: wavelength of 462 nm, forward voltage of 3.4 mV, and output of 5.5 mW, indicating excellent emission efficiency.

Example 3

The procedure of Example 1 was repeated, except that TMA (2 cc/min) was further fed during a growth of barrier layer, thereby growing an $Al_{0.03}Ga_{0.97}N$ barrier layer, and a flow rate of TMI was changed to 10 cc/min during a growth of well layer, thereby growing an $In_{0.03}Ga_{0.97}N$ well layer, to thereby fabricate a nitride semiconductor product and a nitride semiconductor light-emitting device.

Similar to Example 1, the nitride semiconductor light-emitting device was subjected to an aging test. No deterioration in reverse withstand voltage was observed 40 hours after the start of the test.

At a current of 20 mA, the device exhibited the following emission characteristics: wavelength of 395 nm, forward voltage of 3.4 mV, and output of 6.5 mW, indicating excellent emission efficiency in an ultraviolet emission.

Example 4

The procedure of Example 1 was repeated, except that a Ge-doped n-type GaN layer was employed instead of an Si-doped n-type GaN layer, to thereby fabricate a nitride semiconductor product and a nitride semiconductor light-emitting device.

The Ge-doped n-type GaN layer was formed in a following manner. Tetramethylgermanium (TMGe) was fed instead of $SiH_4$ in Example 1, and then the TMGe was stopped. This cycle was repeated one hundred times, to thereby form the Ge-doped n-type GaN layer (thickness: 2 μm) in which Ge concentration was varied periodically.

Similar to Example 1, the nitride semiconductor light-emitting device was subjected to an aging test. No deterioration in reverse withstand voltage was observed 40 hours after the start of the test.

At a current of 20 mA, the device exhibited the following emission characteristics: wavelength of 461 nm, forward voltage of 3.4 mV, and output of 5.4 mW, indicating excellent emission efficiency.

Example 5

The procedure of Example 1 was repeated, except that a Ge-doped n-type GaN layer in Example 4 was employed instead of an Si-doped n-type GaN layer, and a Ge-doped GaN barrier layer (thickness: 16 nm) was employed instead of an undoped GaN barrier layer (thickness: 7 nm), to thereby fabricate a nitride semiconductor product and a nitride semiconductor light-emitting device. Ge concentration in the barrier layer was controlled at $5 \times 10^{17}$ cm$^{-3}$.

As for the procedure to form the barrier layer, the procedure of Example 1 was repeated, except that Tetraethylgermanium (TEGe) was further fed during a growth of barrier layer, and that the growing time of the barrier layer C and E was changed to 8 min. respectively.

Similar to Example 1, the nitride semiconductor light-emitting device was subjected to an aging test. No deterioration in reverse withstand voltage was observed 40 hours after the start of the test.

At a current of 20 mA, the device exhibited the following emission characteristics: wavelength of 461 nm, forward voltage of 3.0 mV, and output of 5.0 mW, indicating excellent emission efficiency.

Comparative Example 1

The procedure of Example 1 was employed to the step of growing an $In_{0.04}Ga_{0.96}N$ cladding layer. Immediately after the growth, ammonia and TEG were fed by the mediation of nitrogen serving as a carrier gas while the temperature was elevated to 1,000° C. over two minutes, thereby forming an undoped GaN barrier sublayer B. No barrier sublayer A was formed. Subsequently, a barrier sublayer C was formed at 1,000° C. for nine minutes.

After stopping of feeding TEG, a substrate was cooled to 800° C. In Comparative Example 1, a barrier sublayer D was not formed. When the substrate temperature reached 800° C., feeding of TEG was resumed, and TMI was also fed. The temperature was maintained for three minutes, thereby for a first well layer composed of InGaN included in the quantum well structure. In Comparative Example 1, no barrier sublayer E was formed.

Figure 3:
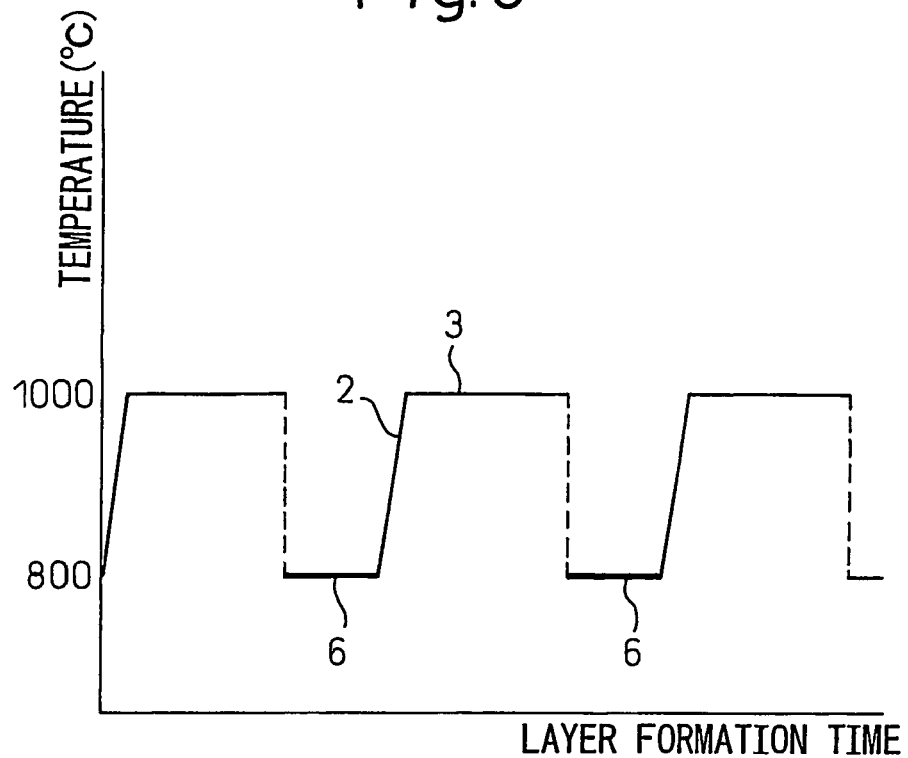
FIG. 3 is a graph showing a growth temperature profile of a quantum well structure of the nitride semiconductor light-emitting layer of Comparative Example 1.

Subsequently, feeding of TMI was stopped, and the temperature was elevated to 1,000° C., thereby growing a barrier sublayer B of the barrier layer 2. The same procedure was repeated five times, to thereby form 5 pairs of the quantum well structure, and a barrier layer 6 was further grown, thereby fabricating a multiple quantum well structure. The same pressure and flow rates of the source gases as employed in Example 1 were employed. FIG. 3 shows a growth temperature profile of a quantum well structure of Comparative Example 1.

Thus, a multiple quantum well structure having five pairs were fabricated. Then, a p-type GaN layer was formed, to thereby produce a nitride semiconductor product. A negative electrode and a positive electrode were provided to the nitride semiconductor product in a manner similar to that of Example 1, thereby fabricating a nitride semiconductor light-emitting device.

Figure 6:
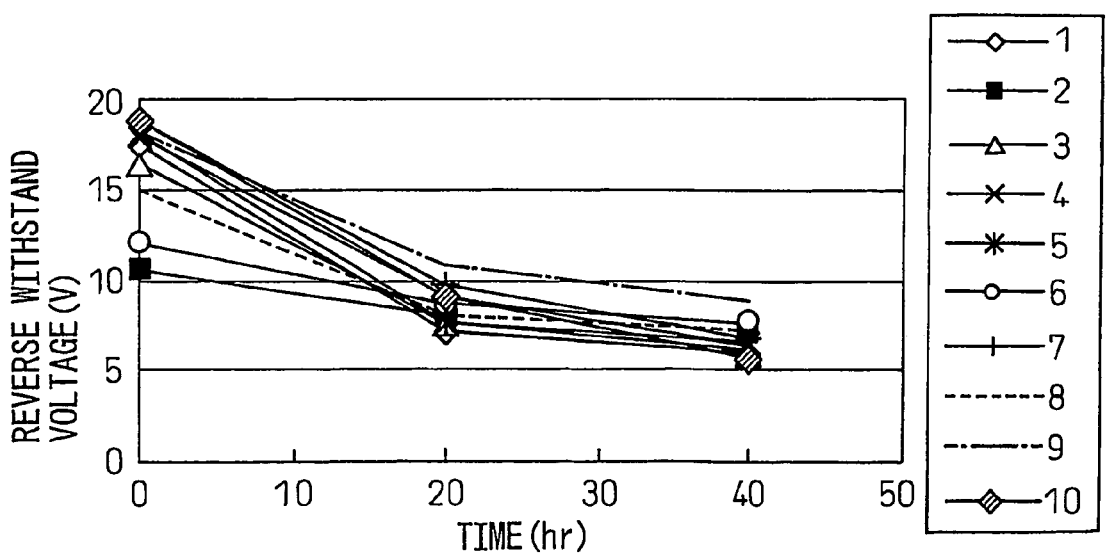
FIG. 6 is a graph showing aging test results of samples of Comparative Examples 1 and 2.

Similar to Example 1, the nitride semiconductor light-emitting device was subjected to an aging test. The results are shown in FIG. 6. In FIG. 6, numerals 1 to 5 represent the samples of Comparative Example 1. As is clear from FIG. 6, reverse withstand voltage was considerably impaired in 20 hours after the start of the test.

At a current of 20 mA, the device exhibited the following emission characteristics: wavelength of 46.3 nm, forward voltage of 3.5 mV, and output of 3.0 mW.

Comparative Example 2

Figure 4:
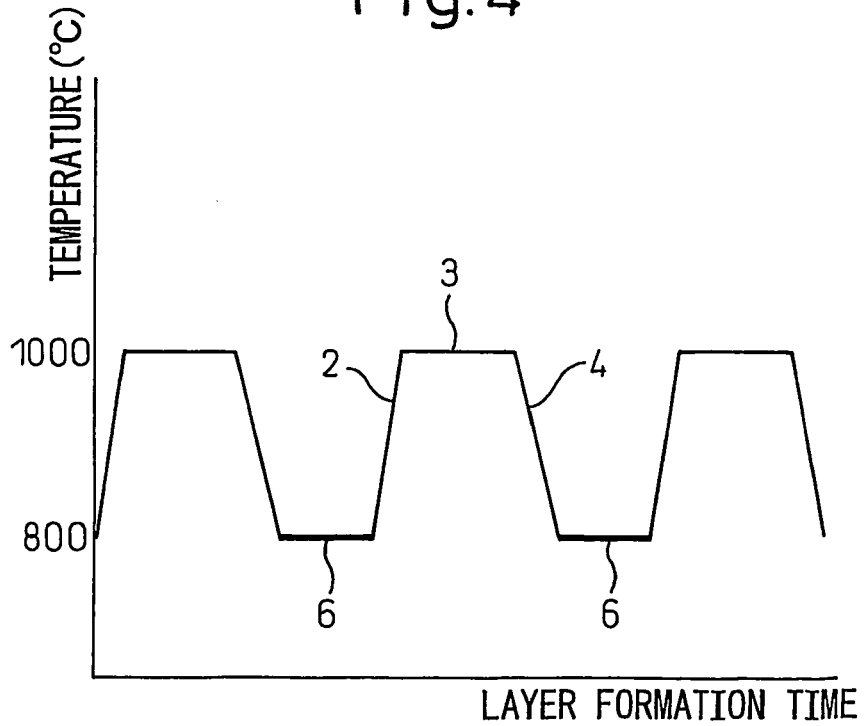
FIG. 4 is a graph showing a growth temperature profile of a quantum well structure of the nitride semiconductor light-emitting layer of Comparative Example 2.

The procedure of Comparative Example 1 was repeated, except that, after formation of a barrier sublayer C, TEG was continued to feed during lowering the temperature from 1,000° C. to 800° C. so as to form a barrier sublayer D, to thereby fabricate a nitride semiconductor light-emitting device. FIG. 4 shows a growth temperature profile of a quantum well structure of Comparative Example 2.

In FIG. 6, numerals 6 to 10 represent the samples of Comparative Example 2. Similar to Comparative Example 1, reverse withstand voltage was considerably impaired in 20 hours after the start of the test. At a current of 20 mA, the device exhibited emission characteristics: wavelength of 461 nm, forward voltage of 3.4 mV, and output of 3.0 mW.

Comparative Example 3

The procedure of Comparative Example 1 was repeated, except that the Ge-doped n-type GaN layer and Ge-doped GaN barrier layer in Example 5 was employed instead of the Si-doped n-type GaN layer and the undoped GaN barrier layer, to thereby fabricate a nitride semiconductor product and a nitride semiconductor light-emitting device.

Similar to Example 1, the nitride semiconductor light-emitting device was subjected to an aging test.

Although time-dependent deterioration in reverse withstand voltage was restrained as compared with Comparative Example 1, it was more severe as compared with each Example. At a current of 20 mA, the device exhibited emission characteristics: wavelength of 463 nm, forward voltage of 3.3 mV, and output of 3.0 mW.

INDUSTRIAL APPLICABILITY

The nitride semiconductor product of the present invention is useful for producing a light-emitting device, and the light-emitting device fabricated from the nitride semiconductor product is useful as a blue-light-emitting device employed in an electronic apparatus such as indicators.

The invention claimed is:

1. A nitride semiconductor product comprising an n-type layer, a light-emitting layer, and a p-type layer which are formed of a nitride semiconductor and sequentially stacked on a substrate in the above order,
said light-emitting layer having a quantum well structure in which a well layer is sandwiched by barrier layers having band gaps wider than the band gap of the well layer, wherein said barrier layers individually comprise a barrier sublayer C which has been grown at a temperature higher than a growth temperature of said well layer, and barrier sublayers A, B and E which have been grown at a temperature lower than a growth temperature of said barrier sublayer C, said barrier sublayers A, B, C, and E are stacked, in this order, said barrier sublayer A is grown by maintaining a temperature lower than a growth temperature of said barrier sublayer C, said barrier sublayer B is grown during elevating a temperature from the growth temperature of said barrier sublayer A to the growth temperature of said barrier sublayer C, the difference between the growth temperature of said barrier sublayer C and the growth temperature of said barrier sublayer E is 50°C. or more, said barrier sublayer E is grown by maintaining the lowered growth temperature after lowering the temperature.

2. A nitride semiconductor product comprising an n-type layer, a light-emitting layer, and a p-type layer which are formed of a nitride semiconductor and sequentially stacked on a substrate in the above order,
said light-emitting layer having a quantum well structure in which a well layer is sandwiched by barrier layers having band gaps wider than the band gap of the well layer, wherein said barrier layers individually comprise a barrier sublayer C which has been grown at a temperature higher than a growth temperature of said well layer, and barrier sublayers D and E which have been grown at a temperature lower than a growth temperature of said barrier sublayer C, said barrier sublayers C, D and E are stacked, in this order, the difference between the growth temperature of said barrier sublayer C and the growth temperature of said barrier sublayer E is 50° C. or more, said barrier sublayer D is grown during lowering the temperature from the growth temperature of said barrier sublayer C to the growth temperature of said barrier sublayer E, and said barrier sublayer E is grown by maintaining the lowered growth temperature after lowering the temperature.

3. A nitride semiconductor product according to claim 1 or 2, wherein the nitride semiconductor is represented by formula

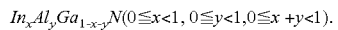
$In_xAl_yGa_{1-x-y}N(0 \leq x<1, 0 \leq y<1, 0 \leq x+y<1)$.

4. A nitride semiconductor product according to claim 1 or 2, wherein the difference between the growth temperature of said barrier sublayer C and the growth temperature of said well layer is 50°C. or more.

5. A nitride semiconductor product according to claim 1 wherein the difference between the growth temperature of said barrier sublayer C and the growth temperature of said barrier sublayer A is 50°C. or more.

6. A nitride semiconductor product according to claim 1 or 2, wherein the growth temperature of said well layer falls within a range of 600°C. to 1,000°C.

7. A nitride semiconductor product according to claim 3, wherein said well layer comprises GaInN.

8. A nitride semiconductor product according to claim 3, wherein said barrier layer comprises GamiN or GaN.

9. A nitride semiconductor product according to claim 1 or 2, wherein at least one layer selected from said well layer and said barrier layer contains an n- type dopant.

10. A nitride semiconductor product according to claim 9, wherein said n-type dopant is Si.

11. A nitride semiconductor product according to claim 9, wherein said n-type dopant is Ge.

12. A nitride semiconductor product according to claim 9, wherein a concentration of said n-type dopant in the layer containing said n-type dopant varies periodically.

13. A nitride semiconductor product according to claim 12, wherein a layer with a higher concentration of said n-type dopant is not thicker than a layer with a lower concentration of said n-type dopant, in the layer containing said n-type dopant.

14. A nitride semiconductor product according to claim 9, wherein the layer containing said n-type dopant has an n-type dopant concentration of $1 \times 10^{16}$ to $5 \times 10^{19}$ $cm^{-3}$.

15. A nitride semiconductor light-emitting device comprising a nitride semiconductor product according to claim 1 or 2, a negative electrode provided on an n-type layer of said nitride semiconductor product and a positive electrode provided on a p-type layer of said nitride semiconductor product.

16. A light-emitting diode comprising a nitride semiconductor product according to claim 1 or 2.

17. A laser device comprising a nitride semiconductor product according to claim 1 or 2.

18. A lamp comprising a nitride semiconductor product according to claim 1 or 2.

19. A method for producing a nitride semiconductor product, said method comprising sequentially stacking on a substrate a nitride semiconductor n-type layer, a nitride semiconductor light-emitting layer of a quantum well structure, and a nitride semiconductor p-type layer, thereby producing a nitride semiconductor product having a quantum well structure, wherein said method comprises growing a well layer;

subsequently, elevating a growth temperature;

growing a barrier layer of the quantum well structure at the elevated temperature, which is higher than a growth temperature of the well layer by 50°C. or more;

subsequently, lowering the growth temperature again by 50°C. or more; and further growing the barrier layer at the lowered temperature.

20. A method for producing a nitride semiconductor product according to claim 19, which further comprises growing said barrier layer before elevating the growth temperature.

21. A method for producing a nitride semiconductor product according to claim 19, wherein growing of said barrier layer is performed in at least one step of elevating the growth temperature and lowering the growth temperature.

22. A method for producing a nitride semiconductor product according to claim 19, wherein said barrier layer contains an n-type dopant.

23. A method for producing a nitride semiconductor light-emitting device, said method comprising a step of producing a nitride semiconductor product comprising an n-type layer, a light-emitting layer and a p-type layer by the method for producing a nitride semiconductor product according to claim 19, a step of removing a portion of a light-emitting layer and a p-type layer of the nitride semiconductor product, thereby exposing an n-type layer, a step of providing a negative electrode on the exposed n-type layer, and a step of providing a positive electrode on the p-type layer.

24. A method for producing a light-emitting diode, comprising a step of providing a lead to a nitride semiconductor light-emitting device produced by the method according to claim 23.

25. A method for producing a laser device, comprising a step of providing a lead to a nitride semiconductor light-emitting device produced by the method according to claim 23.

26. A method for producing a lamp, comprising a step of providing a cover containing a phosphor to a nitride semiconductor light-emitting device produced by the method according to claim 23.

* * * * *